United States Patent
Kroener et al.

(10) Patent No.: US 8,552,829 B2
(45) Date of Patent: Oct. 8, 2013

(54) TRANSFORMER DEVICE AND METHOD FOR MANUFACTURING A TRANSFORMER DEVICE

(75) Inventors: Friedrich Kroener, Villach (AT); Carsten von Koblinski, Bodensdorf (AT)

(73) Assignee: Infineon Technologies Austria AG, Villach (AT)

( * ) Notice: Subject to any disclaimer, the term of this patent is extended or adjusted under 35 U.S.C. 154(b) by 168 days.

(21) Appl. No.: 12/949,974

(22) Filed: Nov. 19, 2010

(65) Prior Publication Data

US 2012/0126926 A1     May 24, 2012

(51) Int. Cl.
*H01F 27/30*     (2006.01)
*H01F 5/00*     (2006.01)
*H01F 27/28*     (2006.01)

(52) U.S. Cl.
USPC ............ 336/199; 336/200; 336/223; 336/232

(58) Field of Classification Search
USPC .......................................... 336/199
See application file for complete search history.

(56) References Cited

U.S. PATENT DOCUMENTS

| | | | |
|---|---|---|---|
| 3,549,825 A * | 12/1970 | Trimble | 360/123.01 |
| 6,201,289 B1 | 3/2001 | Jou | |
| 6,242,791 B1 | 6/2001 | Jou | |
| 7,030,457 B2 | 4/2006 | Ahrens et al. | |
| 2005/0013090 A1 | 1/2005 | Ahrens et al. | |
| 2009/0046489 A1 | 2/2009 | Yoshimura et al. | |
| 2010/0083760 A1* | 4/2010 | Dwyer | 73/514.31 |

FOREIGN PATENT DOCUMENTS

| | | |
|---|---|---|
| DE | 4331499 A1 | 3/1995 |
| DE | 19940035 A1 | 8/1999 |
| DE | 10102367 A1 | 8/2002 |
| DE | 10158798 A1 | 6/2003 |
| DE | 10361014 A1 | 12/2003 |
| DE | 10338471 A1 | 3/2005 |
| EP | 1306902 A1 | 5/2003 |
| EP | 1417691 B1 | 12/2009 |

\* cited by examiner

*Primary Examiner* — Mohamad Musleh
*Assistant Examiner* — Ronald Hinson
(74) *Attorney, Agent, or Firm* — Murphy, Bilak & Homiller, PLLC

(57) ABSTRACT

A transformer device includes a glass substrate having a first side and a second side arranged opposite the first side. A first recess is formed at the first side of the glass substrate. A second recess is formed at the second side of the glass substrate. The first and second recesses are arranged opposite to each other. A first coil is arranged in the first recess and a second coil is arranged in the second recess.

4 Claims, 9 Drawing Sheets

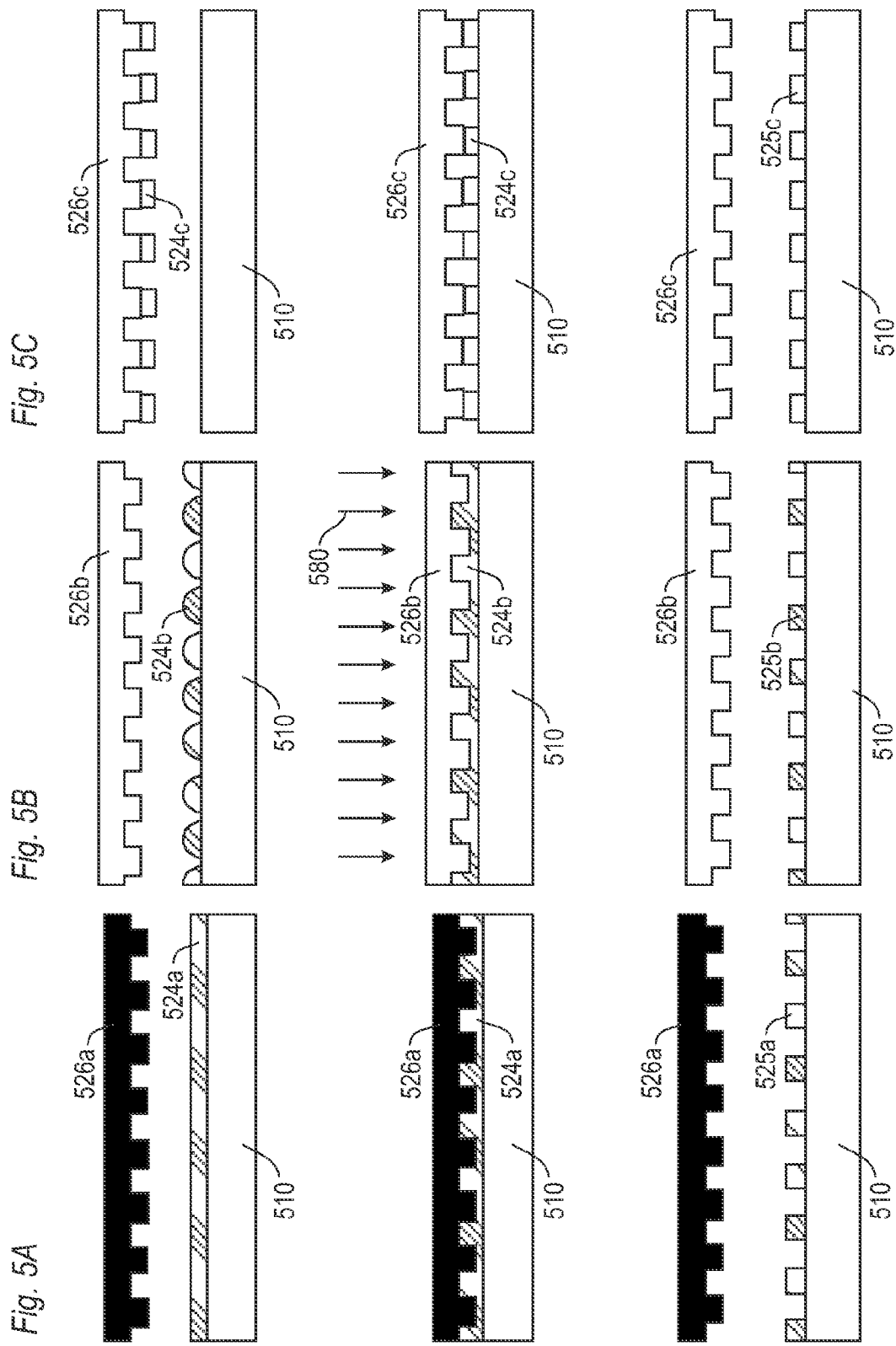

TRANSFORMER DEVICE AND METHOD FOR MANUFACTURING A TRANSFORMER DEVICE

FIELD OF THE INVENTION

The embodiments described herein relate to transformer devices, and particularly to transformer devices integrated into a glass substrate, coreless transformers, transformers having a ferromagnetic core, and methods for manufacturing the same.

BACKGROUND

Inductors and transformers are used for signal processing such as processing of gate signals for power devices. In many applications, in particular high power applications, the primary and secondary coil of the transformer can be operated at different voltages. Such transformers need a reliable electrical insulation between the primary and the secondary coil to prevent electrical breakthrough and malfunction of the power devices. For example, a transformer can be used to couple a low voltage control unit for controlling a high voltage device directly with the high voltage device. Other options for coupling a low voltage device with a high voltage device are fibre optics or integrated circuits on SOI-technology.

Transformers are often integrated into the integrated circuit (IC) of the control unit by using the upper metallisation layer of the IC for forming the primary coil. The upper metallisation is covered by an imide layer on which the secondary coil is formed. Such transformers need additional layers and have a limited dielectric strength due to the imide insulation. Furthermore, a thick imide layer may warp the semiconductor substrate of the IC. Moreover, imide or other synthetic materials used as insulation may degas in sputter tools used for forming the secondary coil which causes additional cleaning of the sputter tools.

SUMMARY

Specific embodiments described herein pertain to, without being limited thereto, a transformer device having at least a first coil on a first side of a glass substrate and a second coil on a second side of the glass substrate wherein the glass substrate forms an electrical insulation between the first coil and the second coil. Further embodiments described herein pertain to, without being limited thereto, coreless transformers using a glass substrate to insulate the primary coil from the secondary coil. Other embodiments described herein pertain to, without being limited thereto, transformers having a ferromagnetic core and a glass substrate which insulates the primary coil from the secondary coil. Further specific embodiments described herein pertain to methods for manufacturing a transformer device.

According to one or more embodiments, a transformer device is provided. The transformer device includes a glass substrate having a first side and a second side arranged opposite the first side. A first recess is formed in the glass substrate at the first side of the glass substrate. A second recess is formed in the glass substrate at the second side of the glass substrate. The first recess and the second recesses are arranged opposite to each other. A first coil is arranged in the first recess and a second coil is arranged in the second recess.

According to one or more embodiments, a transformer device is provided. The transformer device includes a glass substrate having a first portion with a first thickness and a second portion with a second thickness less than the first thickness. The first portion laterally surrounds the second portion. The second portion has a first side and a second side arranged opposite to the first side. A planar primary coil is arranged on the first side of the second portion of the glass substrate. A planar secondary coil is arranged on the second side of the second portion of the glass substrate opposite to the primary coil. The primary coil and the secondary coil are electrically insulated from each other by the second portion of the glass substrate.

According to one or more embodiments, a transformer device is provided. The transformer device includes a glass substrate having a first side and a second side arranged opposite to the first side. A first planar coil includes a conductor arranged on the first side of the glass substrate. The conductor has an end portion arranged distal to the first side of the glass substrate and sidewalls. A second planar coil includes a conductor arranged on the second side of the glass substrate. The first and the second planar coils are arranged opposite to each other. The conductor of the second planar coil has an end portion arranged distal to the second side of the glass substrate and sidewalls. A first ferromagnetic cover is over the first planar coil on the first side of the glass substrate. The first ferromagnetic cover is electrically insulated from the first planar coil and covers the sidewalls and the end portion of the conductor of the first planar coil. A second ferromagnetic cover is over the second planar coil on the second side of the glass substrate. The second ferromagnetic cover is electrically insulated from the second planar coil and covers the sidewalls and the end portion of the conductor of the second planar coil. The glass substrate is arranged between the first cover and second ferromagnetic cover.

According to one or more embodiments, a method for manufacturing a transformer device is provided. The method includes providing a glass substrate having a first side and a second side arranged opposite to the first side; forming a first recess in the glass substrate at the first side of the glass substrate; forming a second recess in the glass substrate at the second side of the glass substrate opposite to the first recess; forming a first coil in the first recess; and forming a second coil in the second recess.

According to one or more embodiments, a method for manufacturing a transformer device is provided. The method includes providing a glass substrate having a first side and a second side arranged opposite to the first side; forming a first planar coil having a conductor on the first side of the glass substrate; forming a first insulating layer on the first planar coil; forming a first ferromagnetic cover over the first planar coil; forming a second planar coil having a conductor on the second side of the glass substrate; forming a second insulating layer on the second planar coil; and forming a second ferromagnetic cover over the second planar coil.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The ele

FIGS. 5A to 5C illustrate imprint processes used for manufacturing an imprint mask according to several embodiments.

DETAILED DESCRIPTION

Figure 1A:
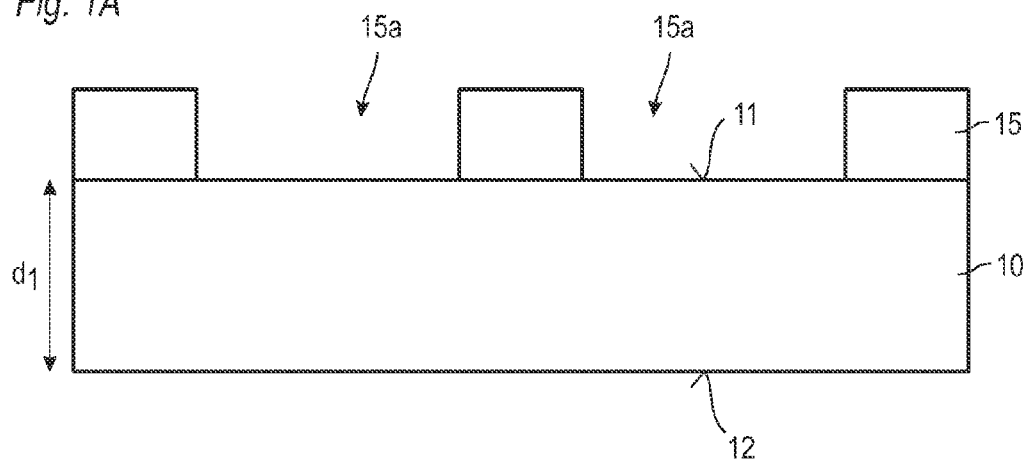
- FIGS. 1A to 1J illustrates processes of a method for manufacturing a transformer device according to one embodiment.

In the following Detailed Description, reference is made to the accompanying drawings, which form a part hereof, and in which are shown by way of illustration specific embodiments in which the invention may be practiced. In this regard, directional terminology, such as "top", "bottom", "front", "back", leading", "trailing" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

It is to be understood that features of the various exemplary embodiments described herein may be combined with each other, unless specifically noted otherwise. For example, features illustrated or described as part of one embodiment can be used in conjunction with features of other embodiments to yield yet a further embodiment. It is intended that the present description includes such modifications and variations.

The term "lateral" as used in this specification intends to describe an orientation parallel to the main surface of a glass substrate.

The term "vertical" as used in this specification intends to describe an orientation, which is arranged perpendicular to the main surface of the glass substrate.

In this specification, a second surface of a glass substrate is considered to be formed by the lower or back-side surface while a first surface is considered to be formed by the upper, front or main surface of the glass substrate. The terms "above" and "below" as used in this specification therefore describe a relative location of a structural feature to another structural feature with consideration of this orientation shown in the Figures.

The terms "magnetically soft core", "magnetic core", "magnetisable core structure" and "ferromagnetic cover" intend to describe structures formed by a "magnetically soft" material which can be easily magnetized and re-magnetized upon applying of an external magnetic field. Examples of magnetically soft materials are unalloyed iron, nickel-iron alloys and cobalt-iron alloys. Such materials do not remain magnetised, or only weakly magnetised, when the field is removed unlike "magnetically hard" materials.

The term "cross-sectional view" intends to describe a vertical cross-sectional view through the glass substrate from the first side to the second side and through the structures formed on both sides of the glass substrate.

When referring to semiconductor devices, at least two-terminal devices are meant, an example is a diode. Semiconductor devices can also be three-terminal devices such as a field-effect transistor (FET), insulated gate bipolar transistor (IGBT), junction field effect transistors (JFET), and thyristors to name a few. The semiconductor devices can also include more than three terminals. According to an embodiment, semiconductor devices are power devices. Integrated circuits include a plurality of integrated devices.

The transformer devices described herein, in the following referred to as transformers, are devices which are manufactured separately from semiconductor devices or integrated circuits so that manufacturing processes used for forming the transformers do not interfere with manufacturing processes of the semiconductor devices or integrated circuits and vice versa. This provides more freedom in tailoring the processes according to specific needs.

The transformer is formed on both sides of a glass substrate as described below. The glass substrate forms an electrical insulation between the first coil and the second coil of the transformer. The first and second coils can also be referred to as primary and secondary coils. The glass substrate provides an electrical insulation having a dielectric strength which is significantly higher than that of imide materials or other synthetic materials usually used for insulation. Therefore, the voltage difference between the first coil and the second coil can be up to 10000 V or higher depending on the glass material used and the selected glass thickness between the first coil and the second coil. Such transformers provide a suitable alternative to other signal transmission devices such as fibre optics or devices based on SOI-technology which are comparably expensive.

With reference to FIGS. 1A to 1J a first embodiment of a method for manufacturing a transformer device is described.

As illustrated in FIG. 1A, a glass substrate or glass wafer 10 having an initial thickness $d_1$ between about 200 μm to about 1000 μm is provided. Typically, the initial thickness $d_1$ can be about 300 μm. The material of the glass substrate 10 can be selected to provide a desired dielectric strength as described further below. According to one embodiment, the glass substrate 10 can be comprised of borosilicate glass such as BF33.

The glass substrate 10 has a first side or surface 11 and a second side or surface 12 arranged opposite to the first side 11. An etching mask 15 having at least one opening 15a, typically a plurality of openings 15a, is formed on the first side 11 of the glass substrate 10. Each opening 15a defines the location and size of a recess to be formed in the glass substrate 10. Etching mask 15 can be of any suitable material for example a photolithographically structurable resist.

Figure 1B:
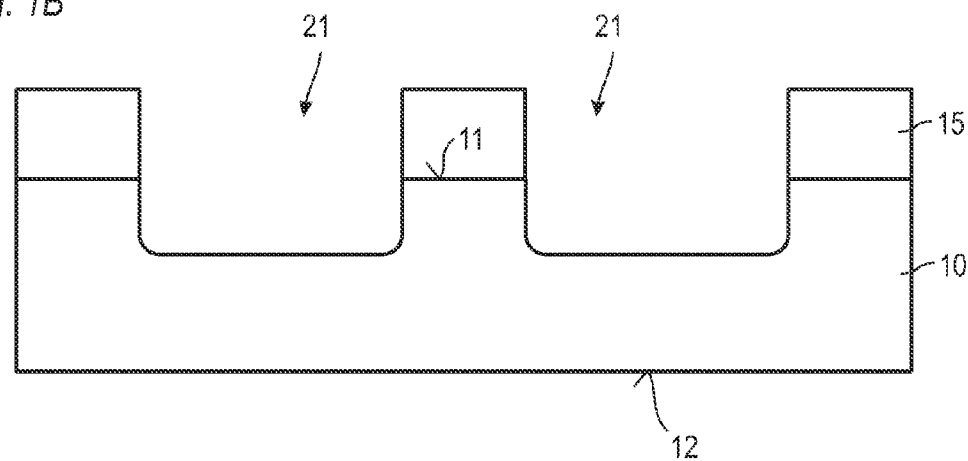

As shown in FIG. 1B, first recesses 21 are etched at the first side 11 of the glass substrate 10 using etching mask 15. Recesses 21 can be wet-chemically etched, for example in a heated HF-solution. In further embodiments, recesses 21 can be dry-chemically etched. The resulting structure is illustrated in FIG. 1B.

Figure 1C:
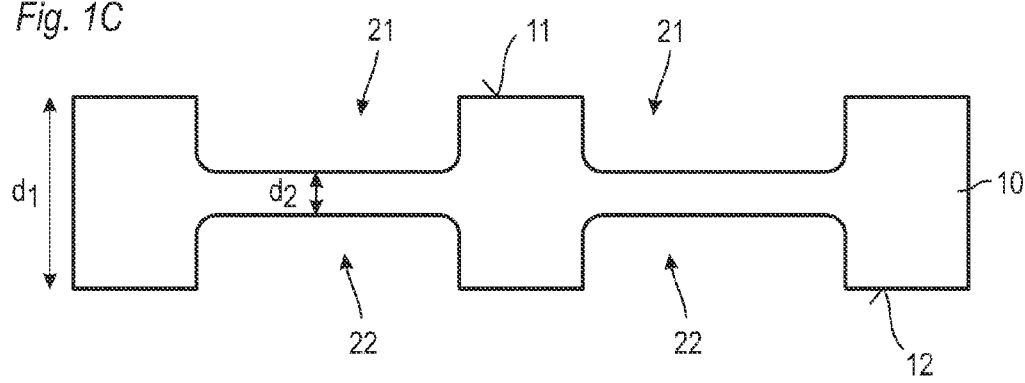

The processes illustrated in FIGS. 1A and 1B are repeated on the second side 12, i.e. a further etching mask is formed on the second side 12 having openings for defining recesses to be etched, and then the second side 12 is etched to form second recesses 22. The resulting structure after removal of the etching masks is illustrated in FIG. 1C. First and second recesses 21, 22 are arranged such that a first recess 21 is arranged opposite to a second recess 22, i.e. a first and a second recess 21, 22 forming a pair of recesses at opposite sides of the glass substrates 10. Typically, first and second recesses 21, 22 having substantially the same size although different size and depth are also possible.

The glass thickness $d_2$ between the first recess 21 and the second recess 22 of a pair of recesses is adjusted to provide a dielectric strength which is sufficient to prevent electrical breakthrough between the first coil and the second coil of the transformer when operating the transformer. Glass thickness $d_2$ can be in a range from about 40 µm to about 100 µm. In one embodiment, glass thickness $d_2$ is about 100 µm.

Figure 1D:
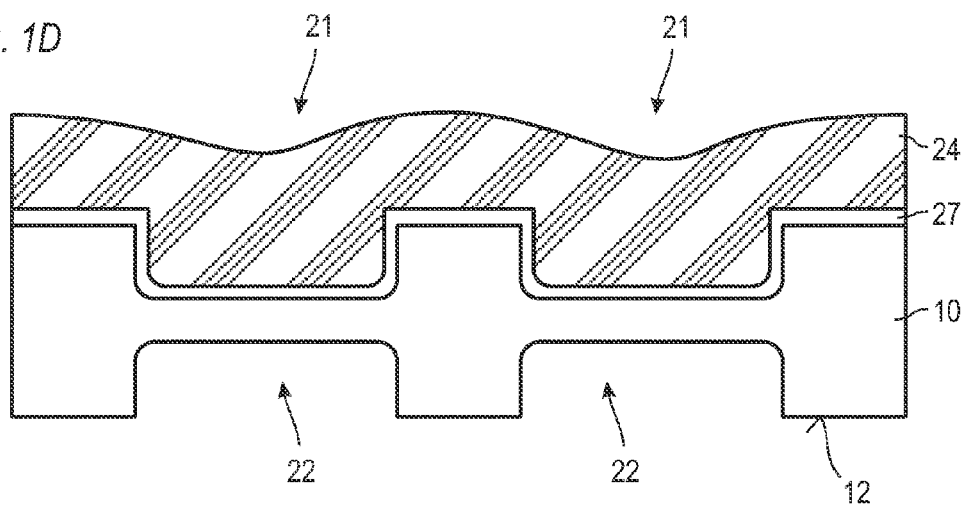

In a further process as illustrated in FIG. 1D, a first seed layer 27 is formed on the first side 11 of the glass substrate 10. First seed layer 27 lines the first recesses 21 and can be, for example, deposited by sputtering. First seed layer 27 can be, for example, a Ti or an Ag layer. A second seed layer can be formed at the same time or subsequently on the second side 12 of the glass substrate. It is also possible to form the second seed layer in a later step. FIG. 1J shows remaining portions 28a of a second seed layer 28 in a final structure.

In a further process, a moldable material 24, typically a thermoplastic material, is applied to the first side 11 of the glass substrate 10. The moldable material 24 at least partially fills the first recesses 21. Typically, moldable material 24 completely fills the first recesses 21 and covers the first side 11 of the glass substrate 10. Moldable material 24 can be, for example a polymer material such as an acryl resist. PMMA (Poly (methyl methacrylate)) is one example.

Figure 1E:
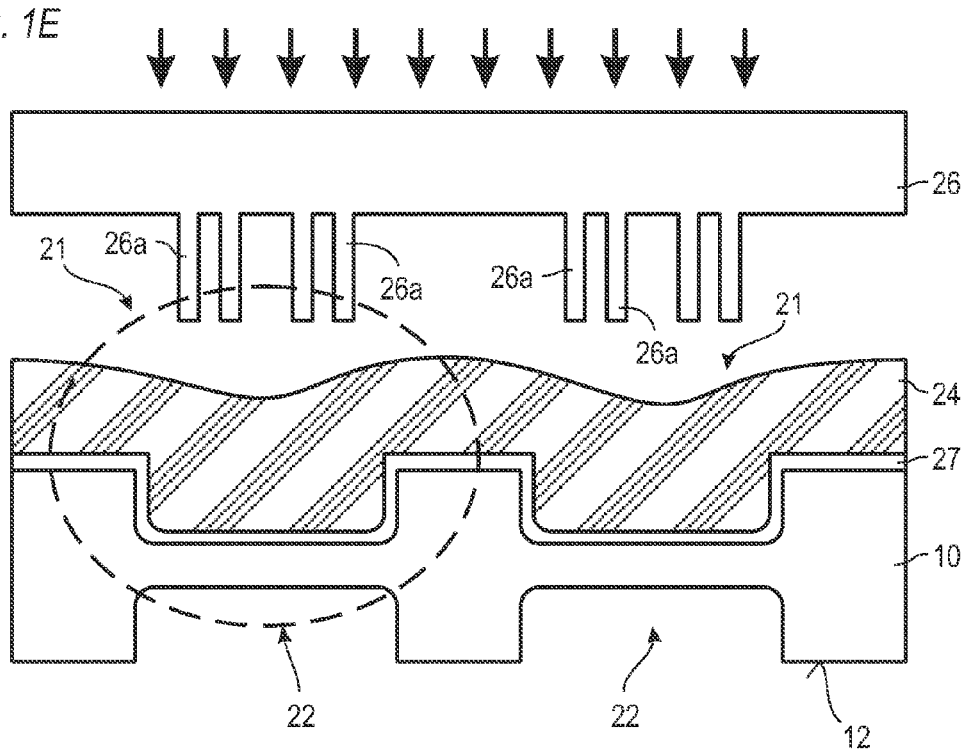

In a further process as illustrated in FIG. 1E, a template 26 having a projecting pattern 26a is provided. The pattern 26a defines structures to be imprinted into the moldable material 24. For example, pattern 26a has projecting structures defining the shape of one or more trenches to be formed in the moldable material 24.

The template 26, which can also be referred to as a master form, is pressed into the moldable material 24 such that the projecting pattern 26a is inserted into the first recesses 21. With respect to FIGS. 1F to 1I details of the following processes are illustrated using the section encircled in FIG. 1E by the dashed line.

Figure 1F:
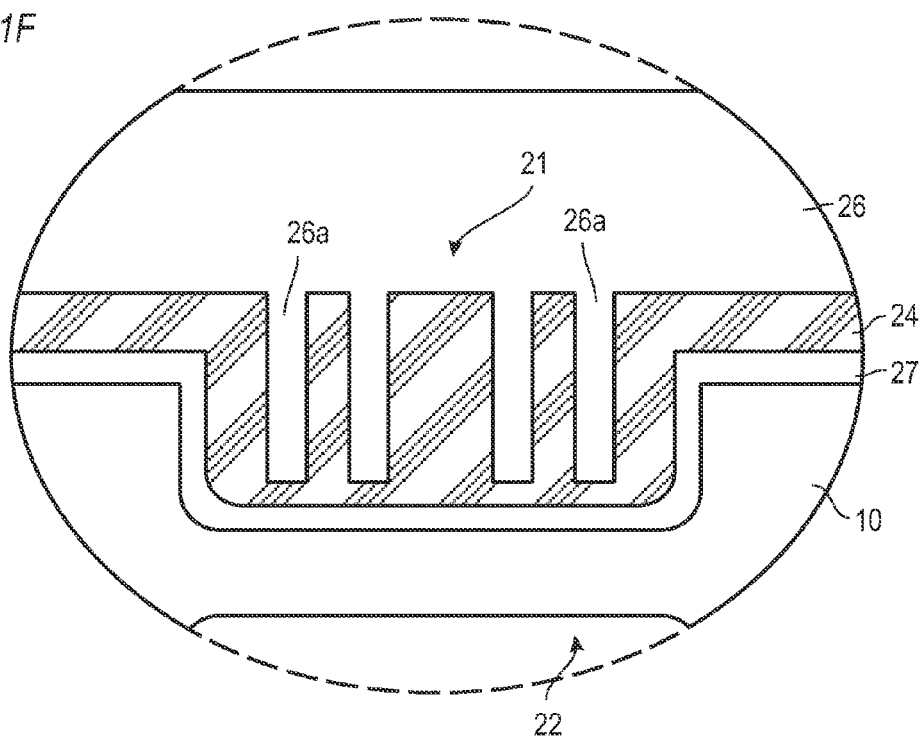

The moldable material 24 is typically heated to become flowable. The heating temperature typically exceeds the glass transition temperature of the polymer forming the moldable material 24. As illustrated in FIG. 1F, the template 26 is then pressed until the projecting pattern 26a reaches or nearly reaches the bottom of the first recesses 21. Typically, the projecting pattern 26a does not reach the first seed layer 27. The heating can also cause cross-linking of the polymer material. After cooling, the template 26 is removed.

In a further process, the moldable material 24 is suitably etched to remove the material left between the projecting pattern 26a and the first seed layer 27 to expose the first seed layer 27 in the trenches 25a of the thus formed imprint mask 25. The above-described processes are one option for forming a mask by imprint lithography. Other options are illustrated in FIGS. 5A to 5C.

Briefly, FIG. 5A illustrates so-called "hot-embossing" as described in connection with FIGS. 1D to 1F. A moldable polymer material 524a is deposited on a substrate 510 and heated above its glass transition temperature. Then a template 526a formed of a comparably hard material is pressed onto the material 524a to transfer the pattern of the template 526a into the polymer material 524a, which is subsequently cooled. After cooling, the template 526a is removed and the polymer material 524a etched to complete imprint mask 525a.

FIG. 5B illustrates so-called UV-imprint lithography using a template 526b which is transparent for UV radiation. Template 526b is typically a quartz glass substrate. UV-curable resist 524b is deposited onto the substrate 510, for example drop-wise, and then template 526b is pressed into the flowable resist 524b to impress the pattern of template 526b. UV-radiation 580 is then used to cure resist 524b which is etched after removal of template 526b to obtain imprint mask 525b.

FIG. 5C illustrates so-called micro-contact printing (µ-CP) using a template 526c having a pattern which is dipped into a solution of a print material to be transferred onto the surface of the substrate 510. Template 526c is usually formed by a resilient material such as silicones, for example PDMS (polydimethylsiloxane). Template 526c is then gently pressed against the substrate to transfer the patterned print material 524c which finally forms an imprint mask 525c on the substrate 510.

By using any one of the above or other suitable imprint processes, an imprint mask 25 having at least one trench 25a is formed in the first recess 21, with the trench 25a extending to and exposing first seed layer 27. The above processes can be summarised as imprint lithography using a template having a projecting pattern which is used to form an imprint mask on the substrate.

Formation of mask layer 25 is, however, not restricted to imprint lithography. For example, photolithography can also be used for forming a mask having a high aspect ratio as described further below.

Figure 1G:
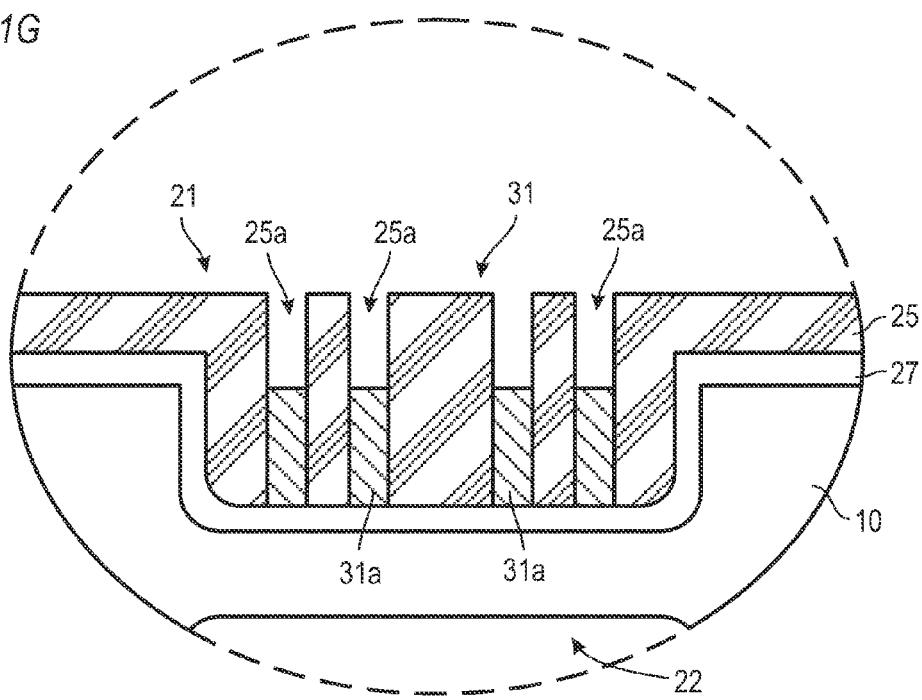

In a further process, as illustrated in FIG. 1G, a conductive material is deposited into the trench or trenches 25a. According to one embodiment, the conductive material is copper or another suitable highly conductive material which is electrolytically deposited, which can also be referred to as electroplating, using the first seed layer 27 as starting layer. For example, a $CuSO_4$ solution can be used for electrolytic copper deposition. Trenches 25a are partially filled to keep material of adjacent trenches 25a separated from each other. It should be noted here that trenches 25a illustrated in the Figures are parts of a single trench comprising one, two or more windings. FIGS. 1F to 1J illustrates a trench having two planar spiral windings. In the cross-sectional view shown in the Figures, such a double winding appear as four trenches 25a.

As illustrated in the Figures, trenches 25a have a comparably large aspect ratio, i.e. the trenches 25a have a depth (or height) which is larger than the width of the trenches 25a. In one embodiment, the aspect ration (height/width) is in a range from about 10 to about 50. Using trenches 25a having such aspect ratio allows formation of a conductor 31a having a similar or slightly less aspect ratio. Conductor 31a is formed by the conductive material deposited into the trenches 25a. High aspect ratio conductors have a large cross-sectional area and therefore a reduced resistance which is beneficial for the quality (or quality factor; Q-factor) of the transformer.

The processes used to form the coils can also be described as pattern-plating process using a plating mask which is formed by mask (imprint mask) 25. Typically, the coils 31, 32 are planar coil, i.e. the windings are formed substantially in the same level on the glass substrate.

Figure 1H:
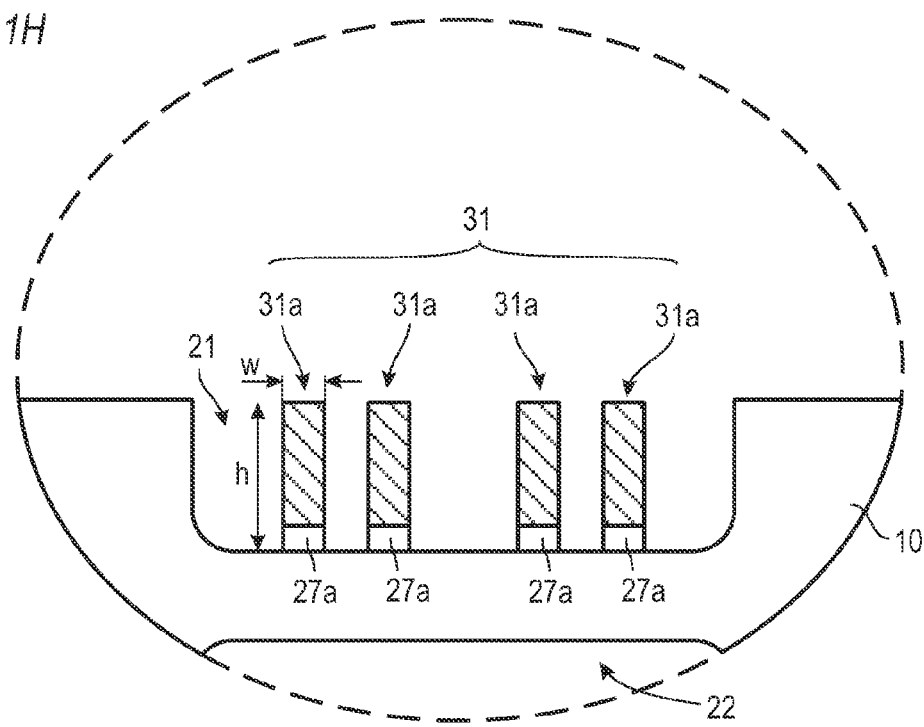

In a further process, as illustrated in FIG. 1H, imprint mask 25 is removed, for example by etching, to expose conductor 31a which forms a first coil 31 arranged in the first recess 21. Removal of imprint mask 25 exposes sidewall portions and an end portion which is distal to the glass substrate 10. In FIG. 1H, this end portion is formed by upper end of the conductor 31a. First seed layer 27 is then etched using the exposed conductor 31a as mask. Portions 27a of first seed layer 27 covered by the conductor 31a remain on the surface of the glass substrate 10.

The final conductor 31a has a cross-section which is formed by the material of the remaining portions 27a of the first seed layer 27 and the deposited conductive material, for example copper. The total height h is given by the thickness of the first seed layer 27 and the thickness of the deposited conductive material as illustrated in FIG. 1H. Typically, first seed layer 27 is thin in comparison to the electrolytically deposited conductive material so that the height h of the final conductor 31a substantially corresponds to the height of the electrolytically deposited conductive material.

Figure 1I:
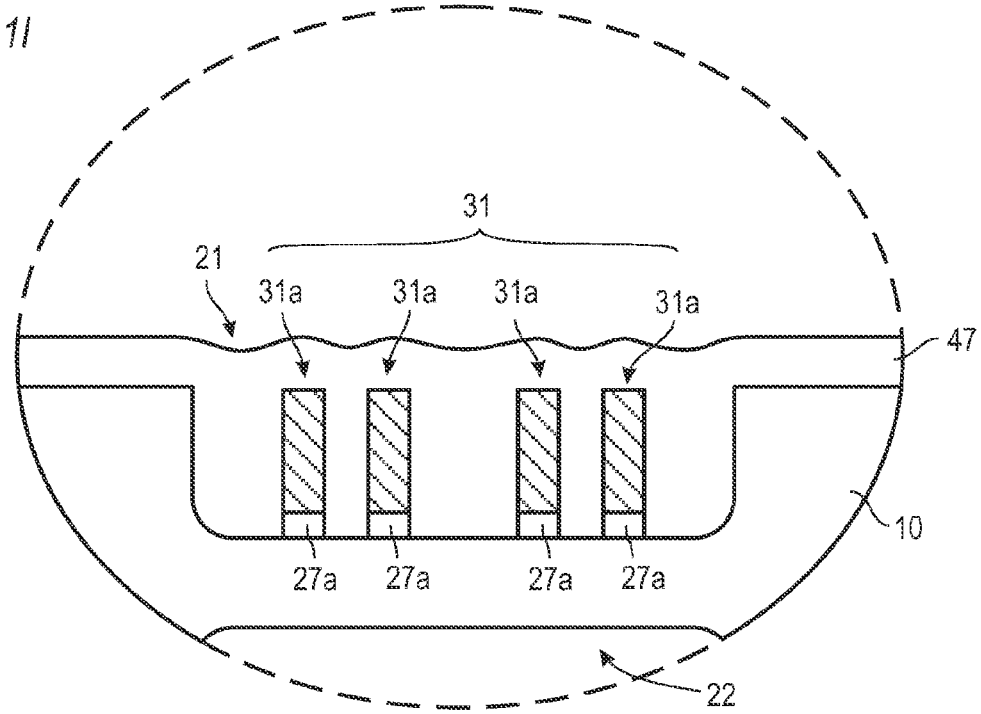
Figure 1J:
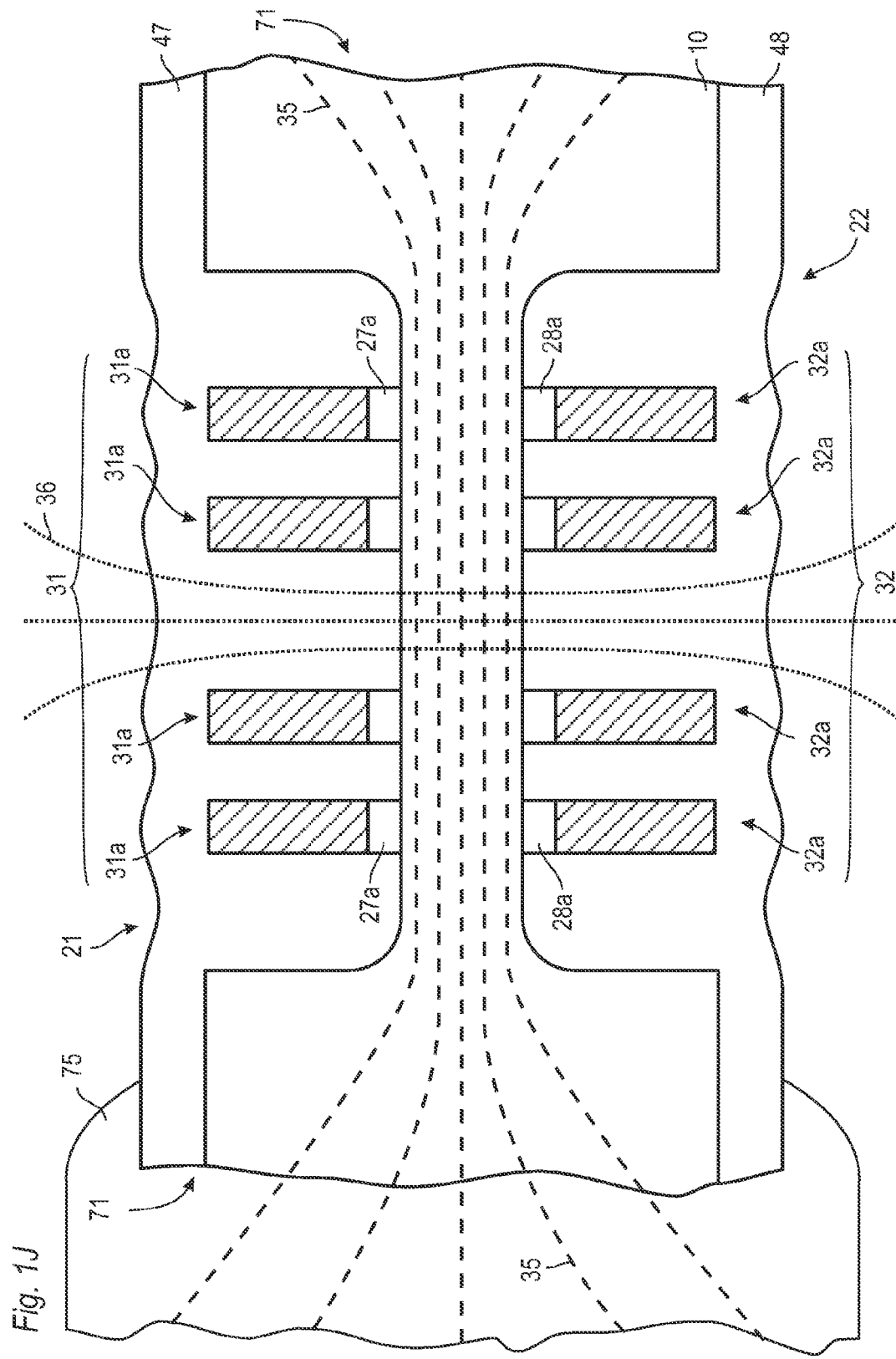

In a further process, as illustrated in FIG. 1I, a passivation layer 47 is deposited onto the first side 11 of the glass substrate 10. Passivation layer 47 completely covers first coil 31 formed by conductor 31a.

When see in a plan view onto the first side of the glass substrate 10, conductor 31a of first coil 31 can be of any shape such as a single-winding coil, a double-winding coil or a coil having more than two spiral windings. The windings can form, when seen in a plan view, a quadratic, elliptic, circular, rectangular or any other shape depending on circumstances.

Figure 2:
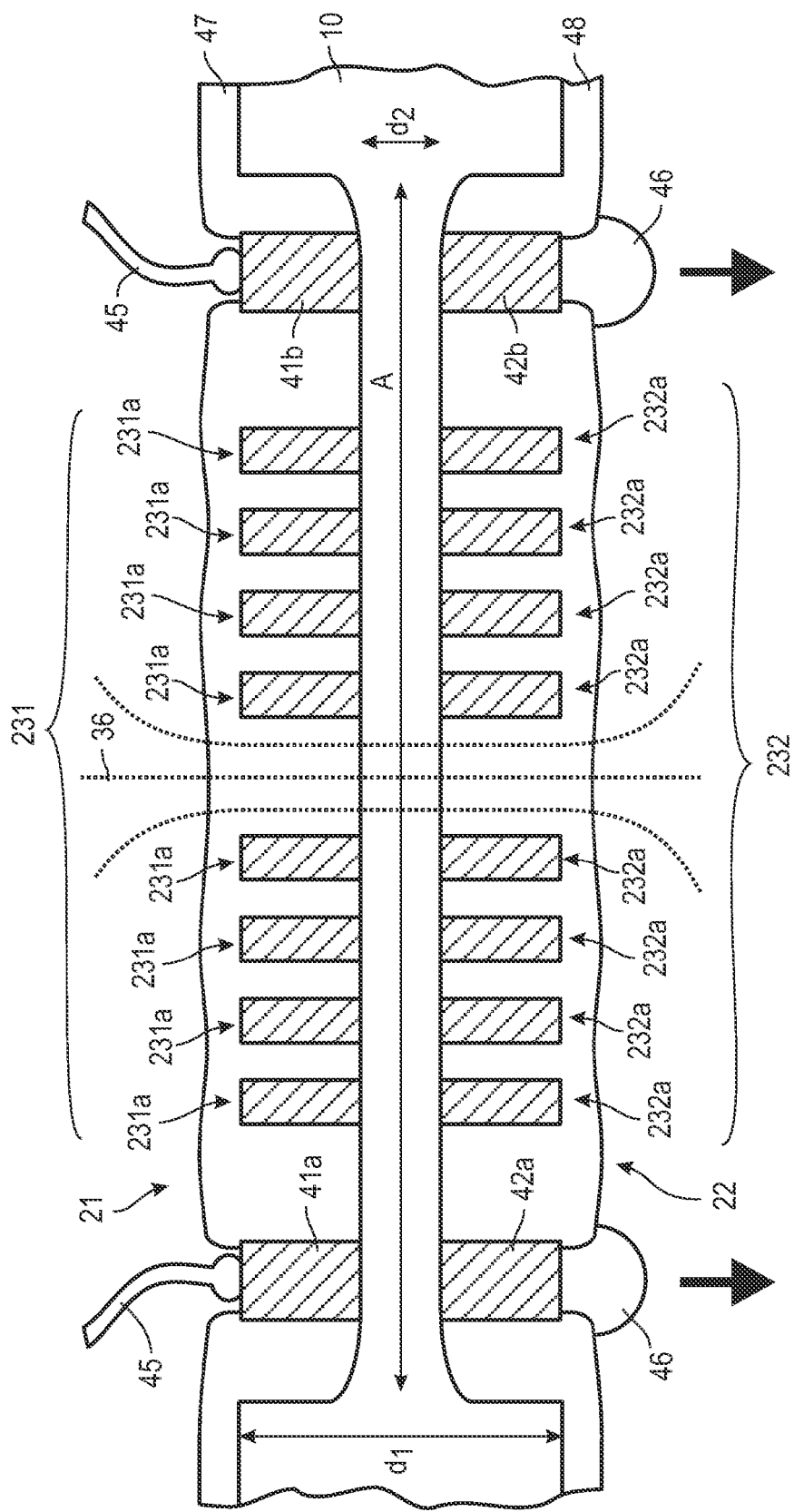
FIG. 2 illustrates a transformer device according to one embodiment.

Imprint mask 25 also defines regions where pad structures are formed to provide electrical contact to the first coil 31. FIG. 2 illustrates a transformer having first pad structures 41a and 41b which are in electrical connection with ends of conductor 31a of the first coil 31. These pad structures 41a and 41b are typically also formed within the first recess 21 and are exposed by etching the passivation layer 47.

Processes illustrated in FIGS. 1D to 1I are repeated on the second side 12 to form a second coil 32 having a conductor 32a which is formed by electrolytically deposited conductive material and portions 28a of the second seed layer 28. Finally, the glass substrate 10 is sawed or otherwise cut to from separate transformers. A resulting structure is illustrated in FIG. 1J with 71 denoting the sawing edge, 48 denoting a passivation material encapsulating the second coil 32, and 75 denoting an insulation material used for encapsulating the transformer.

A skilled person will appreciate that other processes for forming first and second coils 31, 32 can also be used such as printing or pasting. When coils having a high aspect-ratio conductor are desired, imprint lithography or photolithography using a mask formed on the glass substrate 10 is typically used since these techniques allow an easy formation of high aspect masks.

The transformer as described in connection with the embodiment of FIGS. 1A to 1J can have a symmetrical arrangement with respect to the size and location of the first and second recesses 21, 22 and the location of the first and second coils 31, 32 in the respective recesses 21, 22. First and second coils 31, 32 are arranged opposite to each other on different sides of the glass substrate 10. The electrical insulation between the two coils 31, 32 is provided by the glass substrate 10 which has a high dielectric strength and can withstand high voltage differences. It is therefore possible to reduce the glass thickness $d_2$ between the first and second recess 21, 22 to improve electromagnetic coupling between the first and second coils 31, 32. This in turns improves the quality of the transformer.

Glass substrates have a comparably high dielectric strength in comparison to imide resists or other synthetic materials. Therefore, the transformer as described herein can be designed to withstand high voltage differences between the primary coil and the secondary coil (first and second coils) while otherwise providing sufficient electromagnetic coupling between the coils.

The geometrical shape of the glass substrate also improves dielectric insulation. The thin portion of the glass substrate 10 between the first and second recesses 21, 22 forms a second portion having a second thickness while thick regions of the glass substrate 10 outside to the first and second recesses 21, 22, i.e. un-etched regions of the glass substrate 10, form a first portion having a first or initial thickness $d_1$ as described above. The second thickness $d_2$ is less than the first thickness $d_1$. The ratio between $d_1/d_2$ can be in a range from about 2 to about 25. In one embodiment, the ratio $d_1/d_2$ is about 3. The thickness $d_2$ of the second portion is designed to withstand the high voltage difference between the first and second coils 31, 32 while otherwise reducing the distance between the first and second coils 31, 32. For example, thickness $d_2$ of the second portion can be selected such that the second portion (thinned glass region between the first and second recesses 21, 22) provides a dielectric strength sufficient to withstand a voltage difference which is about 3-times of the needed blocking voltage. For example, the initial or first thickness $d_1$ can be about 300 μm, each of the first and second recesses 21, 22 can have a depth of about 100 μm so that the thickness $d_2$ is about 100 μm. The depth of the first and second recesses 21, 22 can be larger than the height of the conductors 31a, 32a formed therein.

The "increased" thickness of the glass substrate 10 lateral to the first and second coils 31, 32 is for controlled reduction of the electric field strength. This is illustrated in FIG. 1J which shows the course of the equipotential or isoelectric lines 35 between the first coil 31 and the second coil 32. The isoelectric lines 35 are comparably closely spaced to each other in the region between the first and second recesses 21, 22 which indicates a high electric field strength. Lateral to the first and second coils 31, 32, the isoelectric lines 35 can spread within the thick glass portion so that the distance between isolectric lines 35 increases, which increase corresponds to a decrease of the electric field strength. This "reduction" of the electric field strength occurs within the glass substrate 10 before the electric field "reaches" other insulating material. For example, insulation material 75 experiences a significantly weaker electrical field than the thin or second portion of the glass substrate 10 between the first and second recesses 21, 22. The large thickness $d_1$ of the glass substrate 10 therefore provides an "insulation match" to allow a "transfer" of the voltage difference between the first and second coils 21, 22 by reduced electric field strength. Insulation material 75 having a lower dielectric strength than the glass substrate 10 can thus form a reliable dielectric insulation. The initial or first thickness $d_1$ outside of the first and second recesses 21, 22 can therefore be selected to allow sufficient "spreading" of the isoelectric lines 35 for this transfer. The thicker glass regions therefore form a lateral insulation or transition region around the transformer. Typically, the thin glass portion (second portion) is laterally completely surrounded by the thick glass portion (first portion).

A person skilled in the art will appreciate that that the course of the isoelectric lines 35 in FIG. 1J is only schematic and indicates only the principal course.

The first and second coils 31, 32 are arranged within the first and second recesses 21, 22 to keep their distance small. The "air gap" between the two coils is defined by the thickness $d_2$ of the glass substrate 10. FIG. 1J also schematically indicates the course of the magnetic field lines 36. As stated above, the distance between the two coils are kept as small as possible while maintaining sufficient dielectric strength. Pads for electrical connecting the respective coils 31, 32 can be arranged within the respective recesses 21, 22 or outside of the recesses 21, 22 on the first portion of the glass substrate 10.

FIG. 1J also illustrates that the respective conductors 31a, 32a of the first and second coils 31, 32 have a cross-section with a comparable high aspect-ratio which allows formation of laterally small transformers while keeping the electrical resistance of the conductors 31a, 32a small.

The transformers described herein are suitable for high voltage applications, for example for coupling of gate control signals to high voltage IGBTs which are used for PWM (pulse width modulation) of current delivered to high power loads such as railway engines and generators of wind turbines. Furthermore, the transformers can also be used for medium or low voltage applications to replace other coupling means between a controlling unit and the driven device.

The transformers can be manufactured in a cost-efficient manner. Particularly the used imprint lithography contributes thereto. The template 26 used for imprinting the trench pattern can be used several times.

FIG. 2 illustrates a coreless transformer according to an embodiment. Similar as the coreless transformer illustrated in FIG. 1J, the coreless transformer of FIG. 2 includes a glass substrate 10 having two recesses 21, 22 arranged on opposite sides of the glass substrate 10. A first coil 231 having four windings 231a in this embodiment is arranged in the first recess 21 while a second coil 232 having four windings 232a is arranged in the second recess 22. A skilled person will appreciate that the number of windings can be selected according to circumstances and does not need to be the same for the first and second coils 231, 232. First contact pads 41a, 41b are arranged in the first recess 21 lateral to the first coil 231 while second contact pads 42a, 42b are arranged in the second recess 22 lateral to the second coil 232. First and second coils 231, 232 can be formed by same or similar processes as described above. Second contact pads 42a, 42b are provided with a conductive glue 46 for connecting the second coil 232, which may form here the primary coil (low voltage side) of the transformer, with an IC which drives the transformer. Alternatively, a solder material can be used instead of a conductive glue. First coil 231 forms the secondary coil (high voltage side). The transformer can be mounted, for example, to an IC or another device by gluing, soldering or any other suitable process. The transformer can also be encapsulated by a passivation material either alone or together with the IC.

The width A of the first and second recesses 21, 22 is selected to provide sufficient space for integrating each of the coils 231, 232 including their respective contact pads 41a, 41b, 42a, 42b. Contact pads 41a, 41b, 42a, 42b can also be formed outside of the recesses 21, 22 on the thick glass portions of the substrate 10. First contact pads 41a, 42b are contacted by respective bond wires 45.

As described above, a plurality of transformers are formed together in the glass substrate 10 and are finally separated from each other by sawing or other suitable cutting means to obtain individual transformers.

Figure 3:
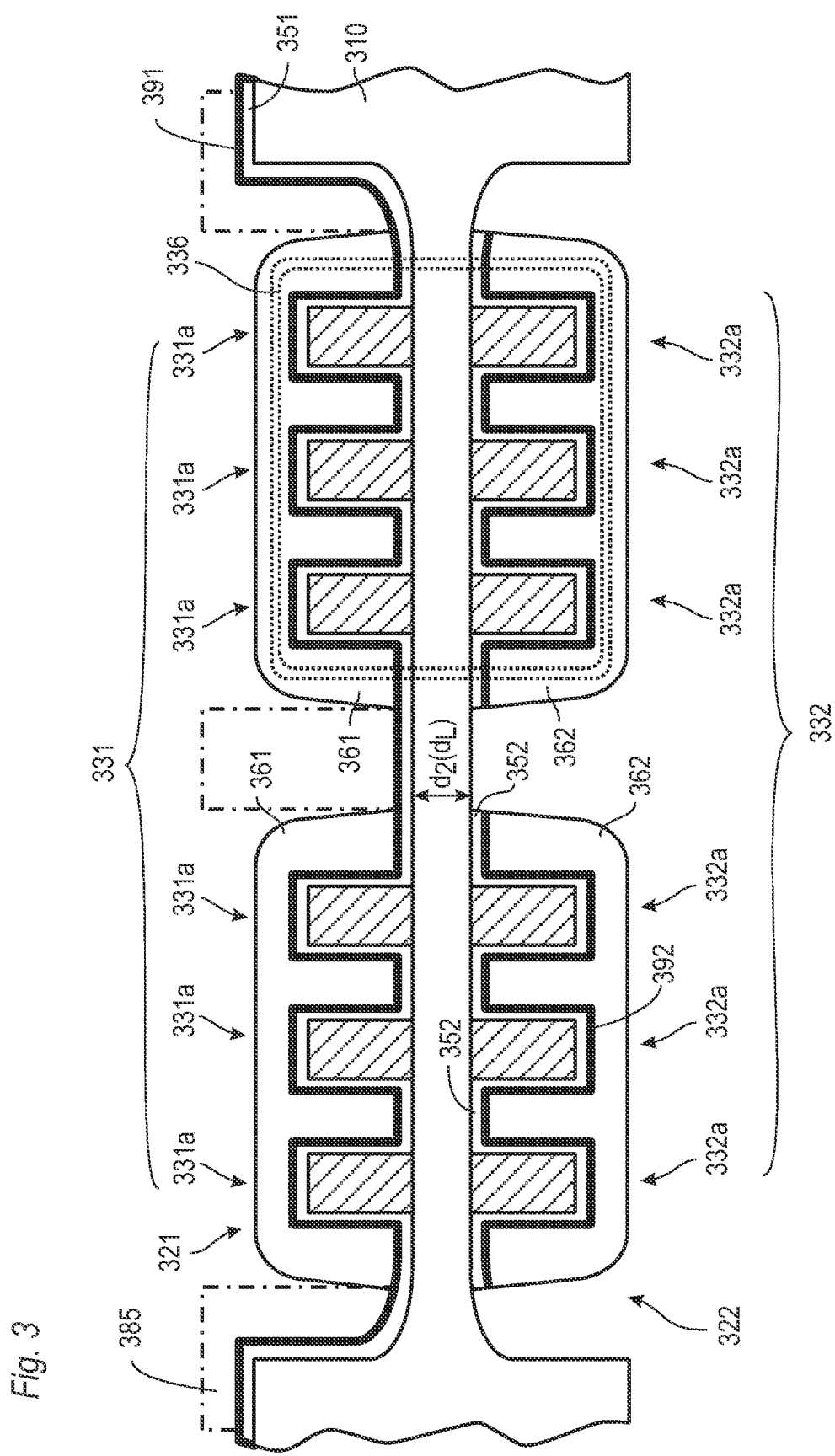
FIG. 3 illustrates a transformer device according to one embodiment.

While FIGS. 1A to 1J and 2 illustrate coreless transformers, FIG. 3 illustrates a transformer having a ferromagnetic core according to an embodiment. Similar as described in connection with above embodiments, a glass substrate 310 having a first recess 321 and a second recess 322 arranged opposite to the first recess 321 is provided. First and second coils 331 and 332 are formed in a respective one of the first and second recesses 321, 322 as described above. First and second seed layers for electrolytical deposition of conductive material and their remaining portions after etching are not shown here for ease of illustration.

In a further process, a first insulating layer 351 is formed on the first side of the glass substrate 310. First insulating layer 351 is comparably thin, for example 5 μm, and does not need to be designed to withstand the voltage difference between the first and the second coil 331, 332. First insulating layer 351 merely provides an electrical insulation between the first coil 331 and a subsequently formed ferromagnetic cover. First insulating layer 351 is designed to withstand voltages which occur due to self-inductance of the coils. These voltages are significantly lower than the voltage between first and second coils 331, 332. For example, first insulating layer 351 can by an oxide layer such as a silicon oxide layer formed by CVD or other suitable deposition processes.

As indicated in FIG. 3, first insulating layer 351 conformally covers the exposed conductors 331a of the first coil 331 such that spaces between adjacent conductors or wirings 331a are not completely filled by the first insulating layer 351. The thickness of the first insulating layer 351 is therefore significantly less than half of the distance between adjacent conductors 331a. Hence, a clearance remains between adjacent conductors 331a which will be filled with a ferromagnetic or magnetically soft material. The remaining clearance between the adjacent windings 331a is selected such that formation of eddy currents in the ferromagnetic material is reduced or avoided.

In a further process, a further seed layer 391 is deposited, for example by sputtering. A mask 385, for example a photo resist layer indicated by dashed-dotted lines, is formed to cover regions where no ferromagnetic cover shall be formed.

Subsequently, ferromagnetic material such as iron is electrolytically deposited on exposed regions of the seed layer 391. Electrolytically deposited iron is comparably pure and has a high magnetic permittivity. A suitable plating bath can include iron chloride (e.g. 375 g/l) and calcium chloride (e.g. 185 g/l). The pH-value of the plating bath is adjusted to be between 1 and 2, and the bath is heated to a temperature between 90° C. and 110° C. Using a current density of about 4 to 20 $A/dm^2$ an iron layer having low hardness and good ductility can be formed. Such a material is suitable for forming a first ferromagnetic cover 361. A skilled person will appreciate that other plating solutions and other ferromagnetic materials can be used as well. The electrolytically deposited iron can have a thickness sufficient to completely encapsulate the conductors 331a and to form a closed ferromagnetic cover 361. For example, iron can be deposited to a thickness of about 100 μm which is sufficient for many applications. Other thicknesses are possible as well.

In a further process, mask 385 is removed and the further seed layer 391 etched to remove the same from regions outside of the ferromagnetic cover 361 using the ferromagnetic cover 361 as mask. It is also possible to remove portions of the first insulating layer 351.

The same processes are carried out at the second side to form second coil 332 covered by a second ferromagnetic cover 362. The thus formed ferromagnetic covers 361, 362 are subsequently annealed. Further processes include forming of passivation layers and suitable electrical connections to the first and second coils 331, 332 which are not shown in FIG. 3.

First and second ferromagnetic covers 361, 362 form together a ferromagnetic core which includes a gap formed by the thinned glass substrate 310 between the first and the second recesses 321, 322. The glass substrate 310 separates the first ferromagnetic cover 361 from the second ferromagnetic cover 362. The gap $d_L$, which substantially corresponds to $d_2$, may reduce the Q-factor of the transformer. Gap $d_L$, which is formed by the thin portion of the glass substrate 310 and the respective insulating layers 351, 352, can be, for example, in a range from about 40 μm to about 110 μm. This is, however, acceptable for many applications. On the other hand, conductors 331a and 332a of the first and second coils 331, 332 are completely surrounded by the ferromagnetic material of the ferromagnetic covers 361 and 362 except on the side facing the glass substrate 310. This configuration improves the transformer quality and at least partially compensates for the gap formed by the glass substrate 310. The magnetic field lines 336 are indicated by dotted lines in FIG. 3 and are constrained substantially within the first and second ferromagnetic covers 361, 362 while passing through the "gap" formed by the glass substrate 310.

The transformer having such a ferromagnetic core 361, 362 exhibits a high quality (Q-factor) and is suitable for signal transmissions in the kHz region up to the MHz region. The geometrical parameters of the ferromagnetic core, i.e. of the first and second ferromagnetic covers 361, 362, and the conductors 331a and 332a can be adapted in view of the signal frequency.

For example, the conductors 331a and 332a can have a high aspect-ratio and can be narrowly spaced so that the clearance between adjacent conductors remains small. In this case, only small "fingers" of the respective ferromagnetic covers 361, 362 are formed. These fingers form the laminates of the ferromagnetic covers 361, 362 are preferably thin enough to avoid generation of eddy currents. The same applies to the width of the conductors. This will be described in connection with FIG. 4 showing the penetration depth of the electric field into different materials depending on the frequency.

Figure 4:
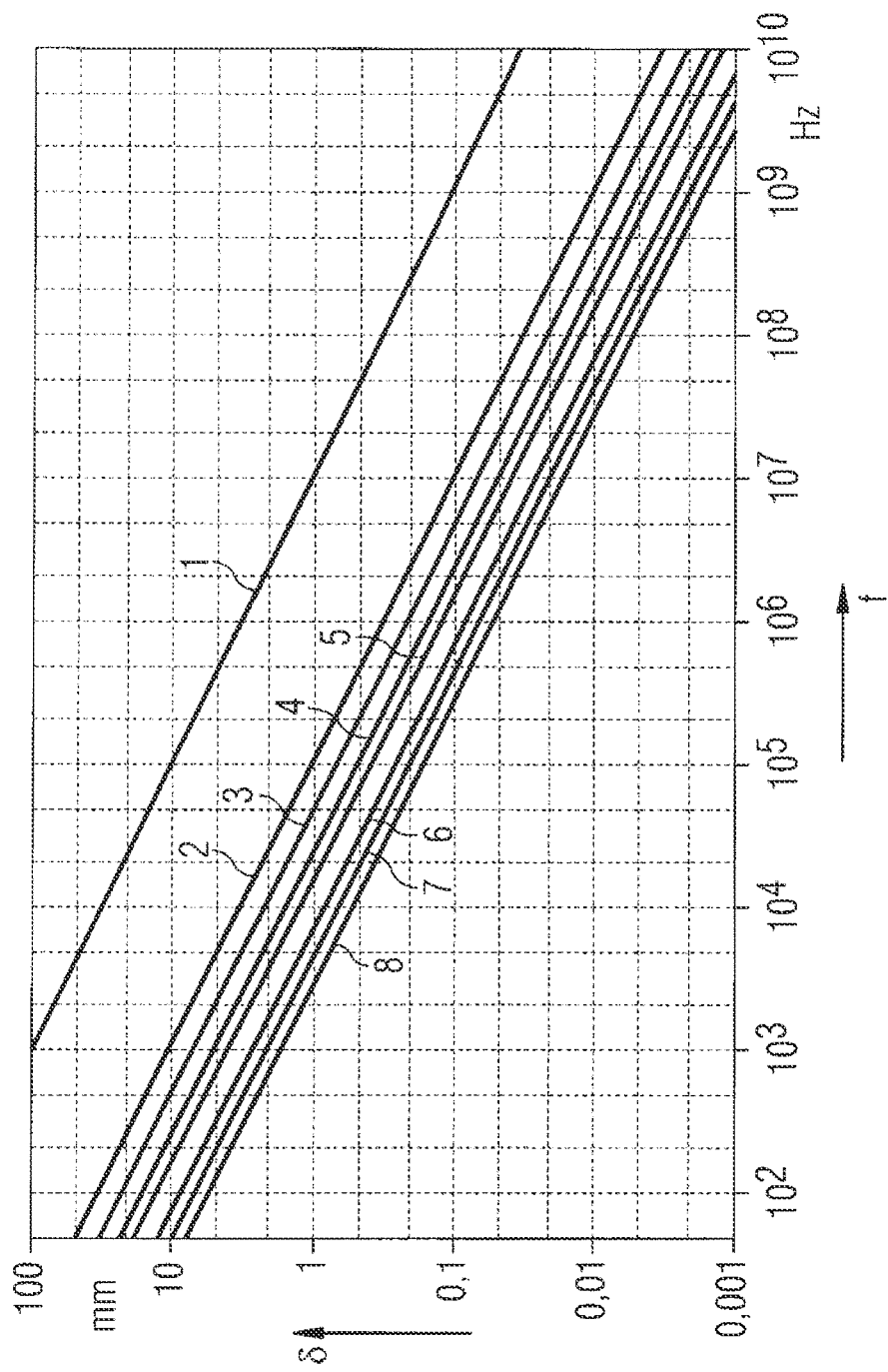
FIG. 4 illustrates the relation between penetration depth of eddy currents and frequency of an electric field for different materials.

FIG. 4 illustrates the penetration depth δ of an alternating electric field for coal (1), Manganin® (2) which is a copper-manganese-nickel alloy, lead (3), tin (4), brass (5), aluminium (6), copper (7) and silver (8). The penetration depth δ of an alternating electric field into a conductive material can be calculated using the following relation:

$$\delta = \sqrt{\frac{2}{\omega \kappa \mu}}$$

with ω denoting the angular frequency of the alternating electric field, κ denoting the electrical conductivity of the conductive material, and μ the permeability of the conductive material. The thickness of the laminates or fingers of the ferromagnetic covers 361, 362 as well as of the conductors is preferably less than the penetration depth δ to suppress generation of eddy current. Different penetration depths δ apply for the conductors and the fingers due to the different materials used. For example, when signals having a frequency of about 1 MHz are considered, the width w of the conductors is preferably less than 50 μm. Formation of such small conductors can be easily achieved by the above described processes. For example, the imprint masks 25 can be formed with trenches 25a having a width of 10 μm or less. Similar estimations can be done for the ferromagnetic covers 361, 362. The width of the ferromagnetic fingers or laminates should be in a similar range as that of the conductors and is typically less than the width of the conductors.

Transformers suitable for transforming signals up to the MHz area can therefore be formed. This is sufficient for many applications such as bridge circuits formed by power devices for transmitting gate signals.

For illustration purposes only, a non-limiting example is subsequently described. The conductors of the respective first and second coils have a cross sectional area with a width of about 10 μm and a height of about 100 μm yielding an aspect ratio (h/w) of 10. A single-winding coil covering an area of about 100 μm by 100 μm by forming a quadratic winding, which has the above cross-sectional dimension, has an inductance of about 1 nH. The inductance of the respective coil can be increased by increasing the number of the windings. Therefore, under the assumption that the total area available for the coil including its pads and its lateral insulation formed by the thick glass substrate is about 1 mm$^2$ or less, coils having an inductance in the range up to few tens nH can be formed.

Increasing the height of the conductors does not significantly change the inductance but decreases the conductors resistance. The quality factor Q of a coil can be estimated by using the following relation:

$$Q = \frac{1}{R}\sqrt{\frac{L}{C}}$$

with R being the resistance of the conductor, L the inductance and C the capacitance formed by the conductor. For a copper coil having dimensions as described above, a quality factor between few hundreds and up to thousand and more can be estimated. When using a ferromagnetic cover as described above, the quality factor can be significantly increased further which also improves the coupling between the two coils.

Herein described are embodiments of transformers having a high-dielectric strength insulation between the primary and the secondary coil. Primary and secondary coil are separated and insulated from each other by a glass substrate having a high dielectric strength, allowing the coils to be arranged close to each other while maintaining sufficient dielectric insulation. Each of the coils can be, for example, a double-winding formed by a conductor having an aspect ratio (height/width) significantly larger than 5, typically larger than 10 or even 20. The lateral insulation of the coils is formed by a glass substrate or a portion of the glass substrate having a larger thickness than the glass substrate arranged directly between the coils to provide a dielectric transition region to "pass" the high voltage difference between the coils to dielectric material having a lower dielectric strength than the glass substrate. To this end, the glass substrate can include two recesses formed on opposite sides of the glass substrate, wherein each of the recesses accommodates a respective one of the two coils.

Each of the two coils can be covered by a respective ferromagnetic cover so that the conductors are covered on sidewall and upper portions by the ferromagnetic cover. The ferromagnetic covers are separated from each other by the glass substrate. The ferromagnetic covers can also be arranged in the recesses. The magnetic flux passes from one ferromagnetic cover to the opposite ferromagnetic cover through the glass substrate.

The transformers have a comparably small size and can be manufactured in a cost-efficient manner on a glass substrate or wafer, with a plurality of transformers formed on the glass wafer which is subsequently cut to separate different transformers.

Terms such as "first", "second", and the like, are used to describe various elements, regions, sections, etc. and not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A transformer device, comprising:
   a glass substrate comprising a first portion with a first thickness and a second portion with a second thickness less than the first thickness, the first portion laterally surrounding the second portion, the second portion having a first side and a second side arranged opposite the first side;
   a planar primary coil arranged on the first side of the second portion of the glass substrate;
   a planar secondary coil arranged on the second side of the second portion of the glass substrate opposite to the primary coil, the primary coil and the secondary coil being electrically insulated from each other by the second portion of the glass substrate.

2. The transformer device according to claim 1, wherein the first portion of the glass substrate laterally surrounds the primary and secondary coils.

3. The transformer device according to claim 1, further comprising:
   a first insulating layer on the primary coil and a first ferromagnetic cover over the primary coil, wherein the first insulating layer electrically insulates the primary coil from the first ferromagnetic cover;
   a second insulating layer on the secondary coil and a second ferromagnetic cover over the secondary coil, wherein the second insulating layer electrically insulates the secondary coil from the second ferromagnetic cover;
   wherein each of the first and second insulating layers has a dielectric strength less than a dielectric strength of the second portion of the glass substrate.

4. The transformer device according to claim 3, wherein each of the first and second ferromagnetic covers at least partially extends between adjacent windings of the respective primary and secondary coils.

* * * * *